United States Patent
Wu et al.

(10) Patent No.: US 7,772,288 B2
(45) Date of Patent: Aug. 10, 2010

(54) GROUP III NITRIDE COATINGS AND METHODS

(75) Inventors: Huaqiang Wu, Mountain View, CA (US); Michael G. Spencer, Ithaca, NY (US); Emmanuel Giannelis, Ithaca, NY (US); Athanasios Bourlinos, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 354 days.

(21) Appl. No.: 11/809,879

(22) Filed: Jun. 1, 2007

(65) Prior Publication Data

US 2008/0050857 A1  Feb. 28, 2008

Related U.S. Application Data

(63) Continuation of application No. PCT/US2005/043637, filed on Dec. 1, 2005, now abandoned.

(60) Provisional application No. 60/631,999, filed on Dec. 1, 2004.

(51) Int. Cl.
*B01F 3/12* (2006.01)
*C09K 11/02* (2006.01)
*C01B 21/06* (2006.01)
*H01L 21/20* (2006.01)

(52) U.S. Cl. .............. 516/33; 516/88; 516/93; 252/301.4 R; 252/301.36

(58) Field of Classification Search ............ 516/33, 516/93, 88; 252/301.4 R, 301.36
See application file for complete search history.

(56) References Cited

U.S. PATENT DOCUMENTS

| | | | |
|---|---|---|---|
| 4,904,411 A | 2/1990 | Novich et al. | |
| 6,653,718 B2 | 11/2003 | Leung et al. | |
| 6,815,064 B2 * | 11/2004 | Treadway et al. | 428/403 |
| 7,381,391 B2 * | 6/2008 | Spencer et al. | 423/290 |
| 7,569,206 B2 * | 8/2009 | Spencer et al. | 423/490 |
| 2003/0017264 A1 * | 1/2003 | Treadway et al. | 427/212 |
| 2003/0030970 A1 * | 2/2003 | Persico et al. | 361/525 |
| 2004/0023010 A1 | 2/2004 | Bulovic et al. | |

FOREIGN PATENT DOCUMENTS

GB  1057703  * 2/1967

OTHER PUBLICATIONS

Manual of Patent Examining Procedure, Original Eighth Edition, Aug. 2001 Latest Revision Jul. 2008, U.S. Department of Commerce United States Patent and Trademark Office, Alexandria, VA, Section 1895.01, pp. 1-7.*
"Application Seial No. 200580041485.8 Office Action Mailed Oct. 23, 2009", 6 pgs.

* cited by examiner

*Primary Examiner*—Daniel S Metzmaier
(74) *Attorney, Agent, or Firm*—Schwegman, Lundberg and Woessner P.A.

(57) ABSTRACT

The invention provides a composition that is a dispersion made from a Group III nitride, a solvent system, and a dispersant. The dispersion can be used to prepare Group III nitride thin films on a wide range of substrates, for example, glass, silicon, silicon dioxide, silicon nitride, silicon carbide, aluminum nitride, sapphire, and organic polymers. The particle size of the Group III nitride used for producing the thin films can be controlled by adjusting centrifugation of the dispersion and selecting a desired layer of supernatant. The dispersant can be removed from the thin films by calcination. The Group III nitride can contain a dopant. Doped Group III nitride thin films can emit visible light upon irradiation. Green, red, and yellow light emissions result from irradiating erbium-, europium-, and cerium-doped gallium nitride, respectively.

35 Claims, 9 Drawing Sheets

GROUP III NITRIDE COATINGS AND METHODS

RELATED APPLICATIONS

This application is a continuation under 35 U.S.C. 111 (a) of International Application No. PCT/US2005/043637 filed Dec. 1, 2005, now abandoned, and published in English as WO 2006/060660 on Jun. 8, 2006, which claims priority from U.S. Provisional Patent Application Ser. No. 60/631,999, filed Dec. 1, 2004, which applications and publication are incorporated herein by reference.

GOVERNMENT FUNDING

The invention described herein was made with government support under contract number N00014-00-1-0716 awarded by the Office of Naval Research. The United States Government has certain rights in this invention.

BACKGROUND OF THE INVENTION

Group III nitrides have received a great deal of attention due to the opto-electronic and electronic properties of their thin films. Group III nitride thin films are typically prepared by depositing layers on sapphire, silicon carbide (SiC), and aluminum nitride (AlN) substrates using Molecular Beam Epitaxy, Metal Organic Chemical Vapor Deposition, or Hydride Vapor Phase Epitaxy techniques. The most widely studied Group III nitride is gallium nitride (GaN), which has only been layered on small substrates, typically 1-4 inches in diameter. This size limitation is due to limited matching of lattice constants and thermal expansion coefficients. Group III nitride thin films have yet to be deposited on large (e.g., one-meter) or flexible substrates using current techniques. Additionally, the cost of preparing Group III nitride thin films is high due to the nature of the growth techniques and substrates involved in the process. Accordingly, new techniques for preparing Group III nitride thin films are needed.

SUMMARY OF THE INVENTION

The invention provides novel compositions including a dispersion made from Group III nitride particles, a solvent system, and a dispersant. The dispersion can be a colloidal dispersion. Dispersants such as celluloses, for example methyl cellulose, have been found to successfully disaggregate Group III nitride particles in a solution or suspension. The particle size of the Group III nitrides used to produce the thin films can be controlled by adjusting the centrifugation of the dispersion and selecting a desired layer of supernatant.

The present invention also provides a novel method for preparing high purity Group III nitride thin films. The Group III nitride thin films can be prepared by a spin coating technique using the novel colloidal dispersion of Group III nitride particles. The colloidal dispersion can be used to prepare Group III nitride thin films on a wide range of substrates, for example, glass, silicon, silicon carbide, aluminum nitride, sapphire, and organic polymers. The technique allows for the use of larger substrates than previously used to prepare Group III nitride thin films. The thin film layer thickness can be controlled by the speed and duration of the spin coating, and can be increased by repeating the spin coating process. The dispersant can be removed from the thin films or otherwise modified by calcination and annealing techniques.

The Group III nitride thin films have highly ordered surface particles based on X-ray diffraction measurements. The Group III nitride particles typically align with their c-plane parallel to the substrate surface. Strong luminescence from these layers has been evidenced by Cathodoluminescence. The Group III nitride can also contain one or more dopants. Doped Group III nitride thin films can produce visible light-emission upon excitation, including green, red, and yellow light, from and erbium, europium, and cerium dopants, respectively. The Group III nitride thin film-covered substrates will be useful in the field of light emitting devices and laser devices.

DETAILED DESCRIPTION OF THE INVENTION

Figure 1:
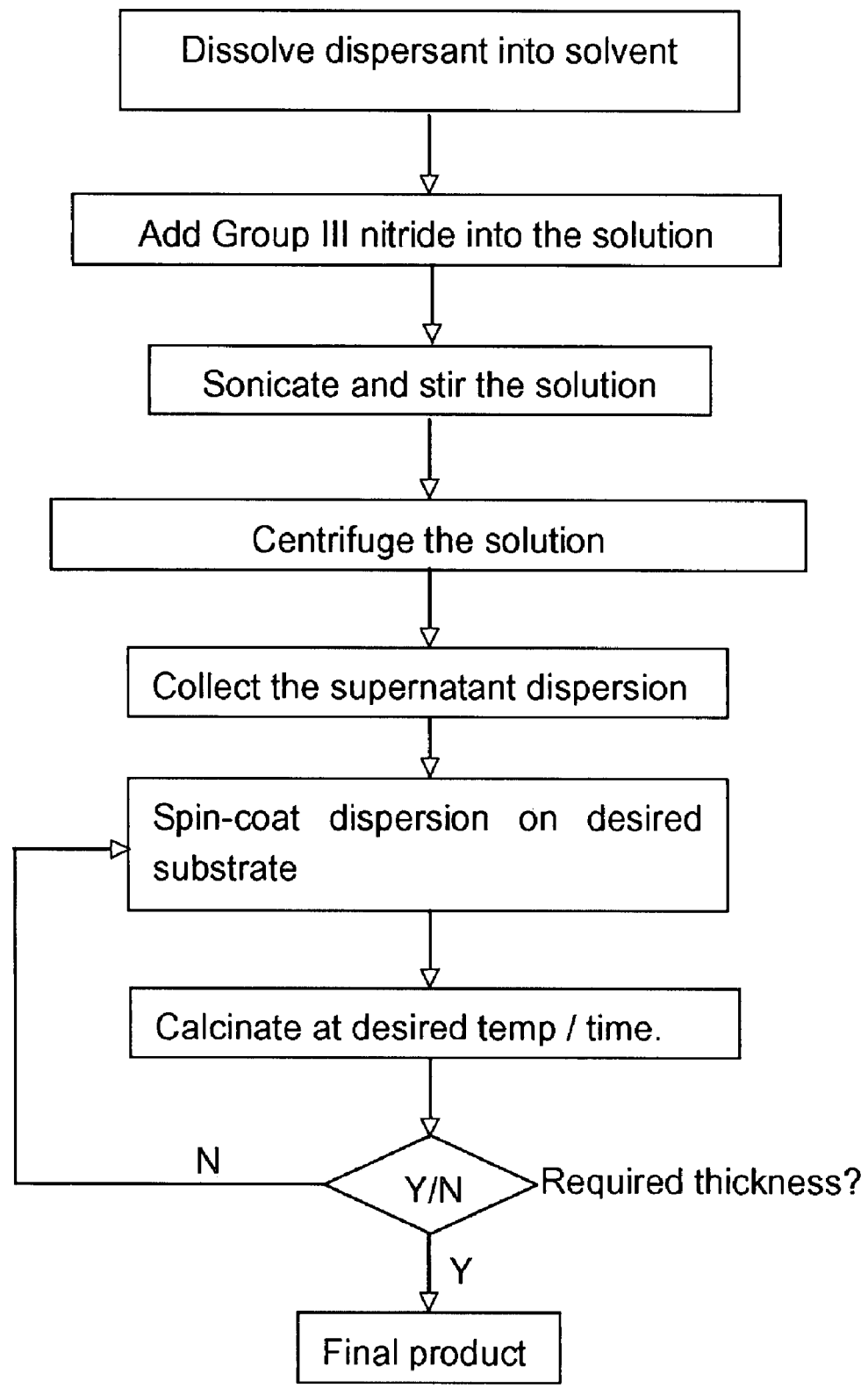
FIG. 1 illustrates a flowchart for the preparation of Group III nitride thin films using a spin coating technique according to one embodiment of the invention.

The invention provides a composition that is a dispersion made from a Group III nitride, a solvent system, and a dispersant. The dispersion can be used to prepare Group III nitride thin films by spin coating on a wide range of substrates. The particle size of the Group III nitride used for producing the thin films can be controlled by adjusting the centrifugation of the dispersion. By adjusting the duration and speed of the centrifugation, different sizes of become deposited at different layers of the centrifugation supernatant. By selecting a discrete layer of supernatant, a desired size range of particles can be obtained. The Group III nitride can contain one or more dopants. The dispersant can be removed from the thin films or otherwise modified by calcination and annealing techniques.

DEFINITIONS

As used herein, a "dispersant" refers to an agent that aids in breaking up or separating fine particles of a solid into another medium, such as a liquid. A dispersant is a material that coats or adsorbs onto the surface of solid particles and facilitates a substantially even distribution of the particles throughout an medium, typically to produce a colloidal suspension.

As used herein, a "dispersion" refers to a colloidal suspension wherein particles of one substance (the dispersed phase) are distributed throughout another substance or solution (the continuous phase). Dispersion is also a process characterized by 1) adsorption (the interaction of a dispersant with a surface via anchoring groups), and 2) stabilization (the interaction of a dispersant with the solvent via stabilizer groups). See Wegner, *Acta Mater.* 2000, 48, 253.

As used herein, a "solvent system" refers to a solvent, or a combination of solvents, used to dissolve or suspend another substance, typically a solid.

As used herein, "Group III nitride" refers to a compound containing nitrogen covalently bonded to a Group III element. Examples of Group III nitrides include boron nitride (BN), aluminum nitride (AlN), gallium nitride (GaN), indium nitride (InN), and thallium nitride (TlN).

As used herein, "Group III element" refers to an element that contains one electron in a p-orbital, wherein the p-orbital is the element's outermost valence orbital. Group III elements include the elements boron (B), aluminum (Al), gallium (Ga), indium (In), and thallium (Tl).

As used herein, "Group III nitride composition" refers to a composition containing a Group III nitride, optionally including other elements, compounds, dopants, or combinations thereof.

As used herein, a "powder" refers to a substance consisting of ground, pulverized, or otherwise finely dispersed solid particles.

As used herein, a "thin film" refers to a layer or set of layers of material. The layer or layers can be about one molecule thick to about 10 µm thick and are typically deposited on a substantially flat solid substrate. Thin films can exhibit various electrochemical and photochemical properties.

As used herein, a "spin coating" refers to a method for the application of thin, substantially uniform films to flat substrates. An excess amount of a solution or dispersion is placed on the substrate and the substrate is then rotated at high speed in order to spread the dissolved- or dispersed-particle containing fluid by centrifugal force. Rotation is continued for a time sufficient to form a substantially even layer, with fluid being spun off the edges of the substrate, until the desired film thickness of particles is achieved. The solvent system can be volatile, allowing for its simultaneous or concomitant evaporation.

As used herein, a "spin coating substrate" refers to any surface upon which a solution, slurry, or dispersion can be placed, and that can be rotated, such as by a spin coating apparatus, to provide a thin film upon the surface. Suitable examples of spin coating substrates include, but are not limited to, wafers or sheets of glass, silicon, silicon carbide (SiC), silicon nitride ($Si_3N_4$), silicon dioxide ($SiO_2$), aluminum nitride (AlN), sapphire, rigid organic polymers, and any other substantially rigid surface that can be modified for use on a spin coating apparatus. Although typically rigid, organic polymer substrates can flexible, even to the point of being able to be formed into a cylinder.

As used herein, a "dip coating" refers to a process of coating a spin coating substrate by immersing the substrate into a solution, slurry, or dispersion, followed by removing the substrate from the slurry or dispersion in a controlled manner.

As used herein, "dopant" refers to a substance that is intentionally added, usually in small amounts, to a pure semiconductor material to alter its conductive properties, typically for use in semiconductors, transistors, and diodes. Suitable dopants include, e.g., beryllium (Be), magnesium (Mg), manganese (Mn), molybdenum (Mo), silicon (Si), and zinc (Zn). Other suitable dopants include rare earth elements, particularly cerium (Ce), samarium (Sm), dysprosium (Dy), erbium (Er), europium (Eu), promethium (Pm), thulium (Tm), and ytterbium (Yb). The dopant can be employed in the form of a pure (elemental) metal. Alternatively, the dopant employed can be in the form of a chemical compound or salt. Rare earth compounds that can be used as dopants, such as, e.g., europium chloride ($EuCl_3$), europium fluoride ($EuF_3$), europium nitrate ($Eu(NO_2)_3$), ytterbium fluoride ($YbF_3$). Suitable dopants also include, e.g., boron, aluminum, or indium, when the Group III element that is the major component of the reaction mixture is not B, Al, or In, respectively. As used herein, "calcination" refers to heating a thin film covered substrate to a high temperature but below the melting or fusing point of the substrate, causing loss of moisture, reduction or oxidation, decomposition, evaporation, or a combination thereof, of components of the thin film of the substrate.

As used herein, "annealing" refers to a heat or laser treatment of a thin film or a thin film substrate to modify or improve physical properties or to relieve residual stresses.

Group III Nitride Dispersions

The invention provides a composition that is a dispersion made from a Group III nitride, a solvent system, and a dispersant. The dispersion can be a colloidal suspension. The dispersion can be prepared by dissolving a dispersant in a solvent system to form a solution or mixture, followed by the adding a Group III nitride to the solution to form a mixture, and agitating the mixture to form a Group III nitride dispersion.

The Group III nitride can be in the form of a powder. The particles of the powder can be crystalline. The crystalline particles can be single crystals, or they can be polycrystalline. The Group III nitride particles used can also be a combination of single crystals, polycrystalline particles, and amorphous particles.

High purity Group III nitride particles form thin films with physical properties that are superior to thin films produced from particles of lower purity. The Group III nitride employed in the dispersion can be greater than about 95% pure by weight, greater than about 99% pure by weight, greater than about 99.9% pure by weight, or greater than about 99.99% pure by weight.

The size of the Group III nitride particles can affect the physical properties of a thin film prepared by spin coating a substrate with a Group III nitride dispersion. A greater amount of Group III nitride particles can be absorbed into a dispersion when smaller particles sizes are employed. Typically, the Group III nitride powder is composed of crystalline particles that are less than about 20 µm in diameter, or less than about 10 µm in diameter. Larger particles can be used in certain embodiments. Certain Group III nitride dispersions consists mostly of, or consist entirely of, crystalline particles that are less than about 20 µm in diameter, less than about 10 µm in diameter, or less than about 5 µm in diameter. Other dispersions contain Group III nitride particles that range in diameter from about 2 nm to about 20 µm in diameter, about 2 nm to about 10 µm in diameter, about 2 nm to about 5 µm in diameter, and about 2 nm to about 1 µm in diameter.

Different Group III nitrides possess different opto-electronic and electronic properties. Various Group III nitrides that can be used to prepare the dispersion include boron nitride, aluminum nitride, gallium nitride, indium nitride, and thallium nitride, or combinations thereof. In one embodiment, the Group III nitride is gallium nitride. In another embodiment, the Group III nitride is not gallium nitride. In another embodiment, the 'Group III nitride' is a combination of Group III nitrides.

The dispersion can be prepared using any suitable solvent system that effectively dissolves the Group III nitride dispersant. The solvent system can be heated to improve the dissolution of the Group III nitride dispersant. The solvent system can be one or more solvents selected from the group consisting of water, methanol, ethanol, dimethyl formamide, dimethyl sulfoxide, dimethyl acetamide, tetrahydrofuran, methylene chloride, and chloroform, or combinations thereof. In one embodiment, the solvent system is deionized water.

A suitable dispersant for Group III nitride particles is important so that once absorbed onto the Group III nitride particle surface, the dispersant can retard agglomeration and sedimentation of the Group III nitride particles in a dispersion or slurry. Any suitable dispersant that effectively adsorbs to a Group III nitride surface and disperses the Group III nitride particles in a solvent system can be used to form the Group III nitride dispersion. Suitable dispersants include cellulose and cellulose derivatives, including synthetically modified cellulose or synthetically prepared cellulose derivatives. Specific dispersants include methyl cellulose (MC), hydroxymethyl cellulose, ethyl cellulose, hydroxyethyl cellulose (HEC), propyl cellulose, 2-hydroxypropyl cellulose (HPC), 2-hydroxyethyl methyl cellulose (HEMC), 2-hydroxyethyl ethyl cellulose (EHEC), 2-hydroxypropyl methyl cellulose (HPMC), 2-hydroxybutyl methyl cellulose, cellulose acetate, cellulose acetate phthalate, calcium carboxycellulose, sodium carboxymethyl cellulose (SCMC), carboxymethyl cellulose, and polyethyleneoxide, and combinations thereof. In one embodiment, the dispersant is methyl cellulose, ethyl cellulose, or polyethyleneoxide, or a combination thereof. In another embodiment, the dispersant is methyl cellulose.

The amount of dispersant used per volume of solvent affects the density of the dispersion. The greater the proportion of dispersant, the greater the density of the solution will be. The solution of the dispersant is typically prepared to achieve about a 1% w/v solution of the dispersant. The solution can also range from about 0.05% w/v dispersant to about 10% w/v dispersant. The solution can also be about 0.5% w/v dispersant, or about 2% w/v dispersant.

The solvent system can optionally be heated to facilitate dissolution of the dispersant. Thus, preparation of the dispersant solution can be facilitated by heating above about 20° C. The mixture or solution can also be heated above about 30° C., about 40° C., about 50° C., about 70° C., about 90° C., about 120° C., about 150° C. The mixture or solution can be heated up to about the boiling point of the solvent system used in the process. The mixture or solution is typically not heated above the boiling point of the solvent system. For example, when water is used as the solvent, the heating is not performed at greater than about 99° C.

The dispersion can be prepared using various ratios of the Group III nitride to dispersant. The ratio of Group III nitride to dispersant can range from about 1:5 (nitride:dispersant) to about 10:1 (nitride:dispersant). Specific rations of nitride to dispersant include about 1:5, about 1:4, about 1:3, about 1:2, about 1:1, about 2:1, about 3:1, about 4:1, about 5:1, about 7.5:1, and about 10:1.

The amount of Group III nitride particles added to the dispersant solution can range from about 1 mg per mL of dispersant solution to about 50 mg per mL of dispersant solution. Typically, the concentration of the Group III nitride in the solvent system is about 10 mg per mL to about 30 mg per mL.

One embodiment of the invention is a dispersion that contains about 3 wt. % Group III nitride, about 1 wt. % dispersant, and about 96 wt. % solvent system. In another embodiment, the dispersion contains about 3 wt. % gallium nitride. Another embodiment includes about 1 wt. % methyl cellulose as a dispersant. Another embodiment employs DI water as the solvent system. A specific dispersion includes about 3 wt. % gallium nitride, about 1 wt. % methyl cellulose, and about 96 wt. % DI water. The supernatant obtained after centrifuging the dispersion can be separated from the majority of the solvent system by any suitable means know to those of skill in the art.

When the Group III nitride is added to the solution of dispersant, the mixture can be shaken or otherwise agitated to effect a substantially uniform distribution of the Group III nitride particles. Typically, the mixture is shaken by hand and then placed into an ultrasonicator for about 15-30 minutes to facilitate formation of the dispersion. Additionally, the mixture can be stirred over a magnetic stir plate for a suitable period of time, typically about 30-60 minutes following agitation by sonication.

Heating the dispersion can help to form a uniform distribution of particles in the dispersion. The dispersion can be a colloid. The dispersion can optionally be heated to facilitate dispersion of the Group III nitride particles and the dispersant in the dispersion. Thus, preparation of the dispersion can be facilitated by heating above about 20° C. The dispersion can also be heated to above about 30° C., above about 40° C., above about 50° C., above about 70° C., above about 90° C., above about 120° C., or above about 150° C. The dispersion can be heated up to about the boiling point of the solvent system used in the process. The dispersion is typically not heated above the boiling point of the solvent system. For example, when water is used as the solvent, the heating is not performed at greater than about 99° C.

The dispersion can be further processed by transferring it into a centrifugation tube and inserting the tube into a centrifugation apparatus. Centrifugation can provide the Group III nitride dispersion as substantially uniform-particle size layers of a supernatant in the centrifugation tube. Centrifugation can be performed for any suitable and effective period of time, and at any suitable and effective rotational speed. The centrifuging can be performed at up to about 10,000 revolutions per minute (rmp), or up to about 8,000 rpm. The centrifuging can also be performed anywhere in the range of about 500 revolutions per minute to about 7,500 revolutions per minute. The centrifuging is typically performed for up to about 60 minutes. Often the dispersant is centrifuged for about 10 minutes.

After centrifugation, the supernatant Group III nitride dispersion can be separated from larger sized particles by removing a portion of the solvent system and removing a bottom layer that contains larger sized particles. The top portion of the solvent system can be removed by any method well known to those of skill in the art, including decanting, pipetting, and siphoning. Relatively large sized particles can be removed from the supernatant by scooping off a top layer (smaller particles) of the supernatant to leave the larger particles behind. Additionally, various layers of the supernatant can contain substantially uniform ranges of Group III nitride particles. Certain ranges of particles can be separated from other different ranges of particles by methodically removing and separating layer after layer of the supernatant to achieve separated supernatants with various particle size ranges.

Spin Coating

The invention provides a method for making a Group III nitride-coated substrate by, for example, preparing a dispersion comprising a Group III nitride and a dispersant; contacting a spin coating substrate with the dispersion; and rotating the substrate at a speed sufficient to form a thin film on the surface of the substrate to provide a thin film-covered substrate. The thin film can then be calcinated to remove the dispersant and any remaining solvent. Furthermore, the process can be repeated to produce thin films of greater thickness. The thin film substrate can be annealed to remove stresses from its structure.

Any suitable and effective spin coating substrate can be employed. Suitable spin coating substrates include silicon, silicon dioxide, silicon nitride, silicon carbide, aluminum nitride, glass, sapphire, and various organic and organometallic polymer compositions. The diameter of the substrate can be as small as 5 mm, or as large as 1.5 meters. The thickness of the substrate can determined by several factors, including material availability and the properties desired from the resulting thin film covered substrate. The flexibility of substrate selection provides significant advantages such as lower cost compared to other thin film preparation methods. The Group III nitride films produced by this technique can be used to make light-emitting devices and laser devices.

Treating the spin coating substrate prior to adding the Group III nitride dispersion can alter or improve the physical properties of the resulting thin films. The substrates are typically cleaned or treated prior to applying the Group III nitride dispersion. Cleaning can include rinsing the surface of the substrate with a solvent, or a series of solvents. The substrate can be cleaned with sequential applications of methanol, acetone, and deionized water. The substrate can also be treated prior to application of the Group III nitride composition by heating or annealing, including laser annealing techniques.

Spin coating or dip coating processes are suitable processes to deposit layers on large area substrates. These techniques have minimal substrate selection requirements and are widely used to produce ceramic thin films. The spin coating substrate can be contacted with the Group III nitride dispersion by any suitable and effective means. The dispersion can be contacted with the substrate by means of a pipette, sprayer, or other applicator device. Alternatively, the spin coating substrate can be contacted with the dispersion by immersing the spin coating substrate into the dispersion, followed by removing the substrate from the dispersion in a controlled manner.

The rotational speed of the spin coating apparatus affects the thickness and particle orientation of the resulting thin film. Spin coating at higher rpm typically produces thinner and more uniform thin films. Any suitable and effective spin speed can be employed. The spin coating substrate is typically rotated at greater than about 30 rpm. The substrate can also be rotated at about 100 to about 8000 revolutions per minute. Additionally, the substrate can be rotated at about 1000 to about 3000 rpm, or at about 2000 rpm.

The duration of the spin coating procedure also affects the thickness and particle orientation of the resulting thin film. The spin coating substrate is typically spun for about 5-120 seconds. Longer durations of up to several hours can be employed for certain embodiments. Certain embodiments requiring only about 10-40 seconds of spinning. Typically, 10 seconds of spinning at the highest desired rpm produces satisfactory results.

Depending on the speed and duration of the spin coating process, and on the nature of the Group III nitride dispersion employed, thin films of various thicknesses can be prepared. Additionally, by repeating the application step, spin coating step, and optionally the calcination processes, thin films of greater thicknesses and different properties can be achieved. The thin film can have a thickness of about 20 nm to about 1 µm. The thin films can have a thickness of about 50-150 nm after one cycle of spin coating, and often have a thickness of about 100 nm after one spin coating process. The density of the particles in the layer and the thickness of the Group III nitride thin film can be controlled by adjusting the rotation speed in centrifugation step, the spin coating step, or both. The thickness of the thin films can be determined by SEM cross-section images. High temperature annealing and laser annealing techniques can be used to improve the quality and continuity of the layer.

Calcination can be performed at any suitable and effective temperature. Calcination can be performed under an air atmosphere, or under atmospheres of specific gases, or combinations thereof. For example, calcination can be carried out under a nitrogen atmosphere, or an argon atmosphere. At a suitable temperature under air, the dispersant effectively disintegrates by combustion and evaporation, leaving behind a pure Group III nitride thin film. The calcination can be performed at above about 300° C., above about 400° C., above about 450° C., or above about 500° C.

The calcination can also be performed under an atmosphere of one or more specific gases. Inert atmospheres include atmospheres composes of noble gases (helium, neon, argon, krypton, xenon, and radon), nitrogen gas, and combinations thereof. Other specific gases include, for example, oxygen, hydrogen, vaporized liquid compounds, and combinations thereof. Calcination performed under, for example, argon or nitrogen gas, can chemically modify the dispersant but does not completely remove the dispersant (or modified components or derivatives thereof) from the thin film, leaving behind a residue which modifies the physical properties of the thin film. Vaporized liquid atmospheres can also be used to alter the physical and chemical characteristics of a Group III nitride thin film.

Dopants

Dopants can alter the conductive properties of a material. The Group III nitride used to prepare the Group III nitride dispersion can contain one or more dopants. Suitable dopants include beryllium, magnesium, manganese, molybdenum, silicon, zinc, cerium, erbium, europium, praseodymium, promethium, thulium, terbium, ytterbium, and yttrium, and compounds thereof, and combinations thereof. Suitable dopants also include Group III nitrides. Other suitable dopants include Group III elements. In one embodiment, the dopant is erbium. In another embodiment, the dopant is europium. In another embodiment, the dopant is cerium. In another embodiment, the dopant is beryllium.

Luminescence is an important property for light emitting devices or laser device applications. GaN has a 3.4 eV band gap and can emit 366 nm UV light from the band edge emission. Rare earth doping in GaN can produce light in the visible region, as well as the infrared region, from its thin films. Irradiating dopant-containing Group III nitrides can also produce various emissions from thin films, depending on the dopant and the source of irradiation.

Luminescence from Group III nitride thin films deposited on various substrates implies a wide range of applicability in the field of light emitting and laser devices. The layer quality can be further improved by optimizing various parameters of the process and by laser annealing the substrate either before or after the thin film is formed. Important advantages of the techniques disclosed herein are low cost, low temperature processes, flexible substrate types, and large substrate sizes.

Analysis of a GaN thin film layer shows that the GaN particles are highly ordered based on X-ray diffraction measurements. Strong luminescence from these layers has been evidenced by Cathodoluminescence (CL). Methyl cellulose has been show to be a successful dispersant to disaggregate GaN particles in solution to form a colloid. The colloidal dispersions have been spun on various substrates, including silicon, sapphire, and glass. The layer thickness can be controlled by the speed and duration of spin coating, and the layer thickness can be increased by repeating the overall spin coating process.

Strong green emission from erbium transitions was detected by Photoluminescence (PL) in erbium-doped GaN thin films. Additionally, red emission was detected from europium-doped GaN thin films and yellow emission was detected from cerium-doped GaN thin films. Thus, the GaN layered substrates are useful for preparing light emitting and laser devices.

A new spin-coating method is provided to produce Group III nitride thin films on various substrates, such as, for example, silicon, glass and sapphire, using a colloidal dispersion, such as methylcellulose coated GaN particles. The methods include steps to make dispersions from Group III nitride particles, to produce Group III nitride layers on substrate by spin coating, and to optionally remove the dispersant by calcination.

The layer thickness can be increased by repeating spin coating and calcination steps. XRD results showed strong regular orientation of GaN layers manufactured by these methods. Most GaN particles are orientated on the surface with their c-plane parallel to the substrate surface. Both CL and PL spectra showed strong luminescence from these layers. Thus, Group III nitride thin films will have a wide array of applications in the field of electroluminescence devices and laser devices.

EXAMPLES

Example 1

Gallium Nitride Thin Film on Silicon

Figure 2:
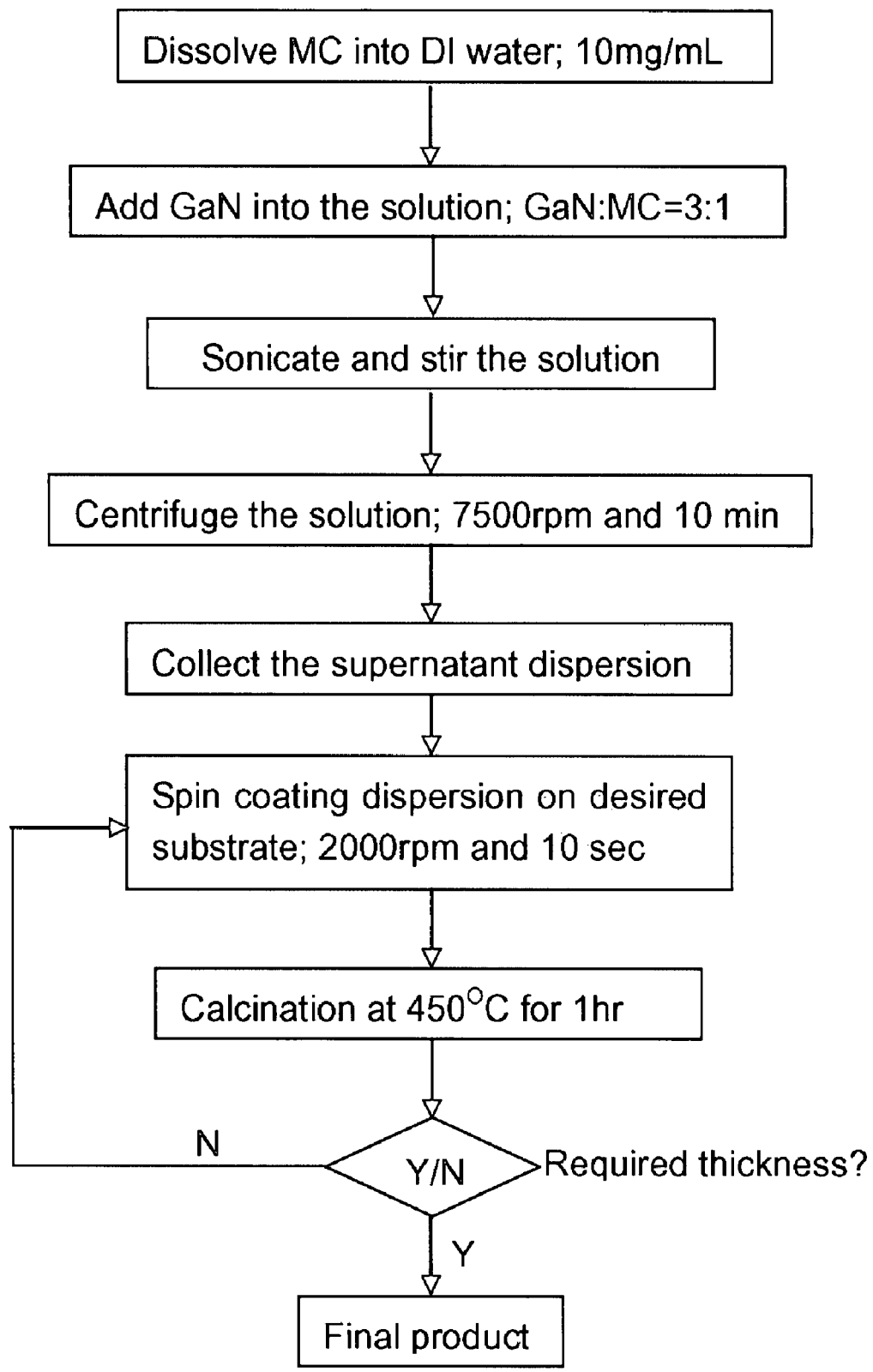
FIG. 2 illustrates a flowchart for the preparation of GaN thin films using a spin coating technique according to one embodiment of the invention.

The fabrication of gallium nitride (GaN) thin films by spin coating is disclosed herein. FIG. 2 illustrates a flowchart for the preparation of GaN thin films using a methyl cellulose dispersion and a spin coating technique. The structure, morphology, and luminescence properties of these thin films are characterized and described below.

Materials and Methods

To prepare a thin film of GaN, a colloidal dispersion was first prepared. Methyl cellulose (MC) was found to be an excellent dispersant for GaN particles. Methyl cellulose powder was dissolved in DI water at a concentration of 10 mg/mL. A transparent solution was obtained by stirring over a magnetic plate for 2-24 hours. Finely-ground high-purity GaN powder was added to the MC solution and the mixture was agitated on an ultrasonicator for 15-30 minutes. After the GaN particles were evenly distributed throughout the dispersion, the dispersion was placed in a centrifugation facility. The dispersion was centrifuged for 10 minutes at 7500 rpm. After centrifugation, large particles that were not disaggregated or dispersed were removed from the dispersion. The remaining supernatant dispersion was collected and used in the spin coating step.

A silicon substrate was prepared by cleaning with methanol, acetone and DI water (sequential rinses). The GaN dispersion was pipetted onto the silicon substrate such that the entire surface was covered. The silicon substrate was then placed on a spin coating apparatus. The parameters for the spin coating step were 1500 rpm/minute acceleration, 2000 rpm for 10 seconds, followed by 10 seconds of deceleration. A uniform layer of the GaN dispersion was formed on the silicon substrate.

To remove the methyl cellulose, the layered substrate was calcinated at 450° C. in air. After one hour, all methyl cellulose was eliminated from the substrate surface, leaving behind only a thin GaN layer on the surface. The spin coating layer was about 100 nm thick. The spin coating and calcination steps were repeated twice to produce a thin film of about 500 nm in thickness.

Results and Analysis

Figure 3:
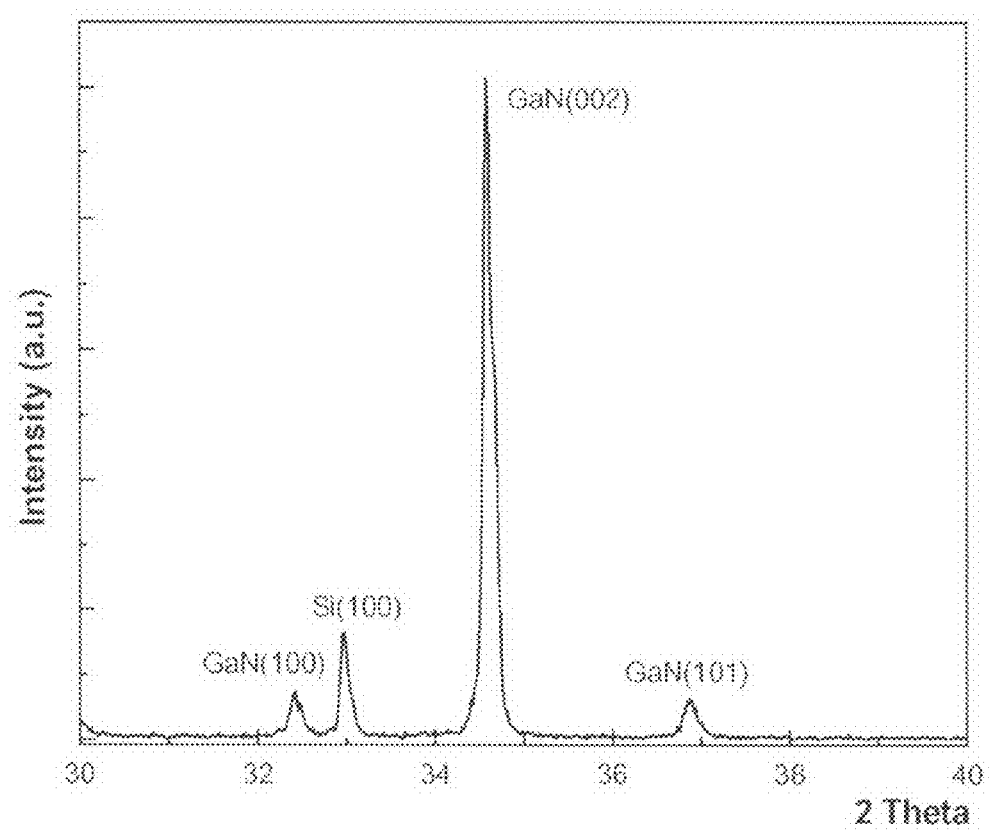
FIG. 3 illustrates the X-ray diffraction pattern of a GaN thin film on a silicon substrate after three GaN thin films were deposited.
Figure 4:
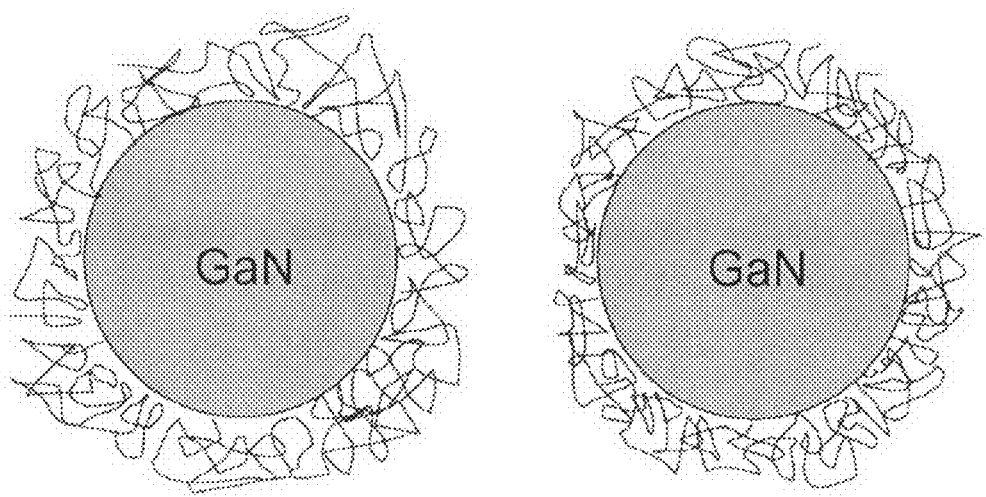
FIG. 4 illustrates the stabilization of GaN particles in an aqueous suspension by adsorption of methylcellulose, according to an embodiment of the invention.
Figure 5A:
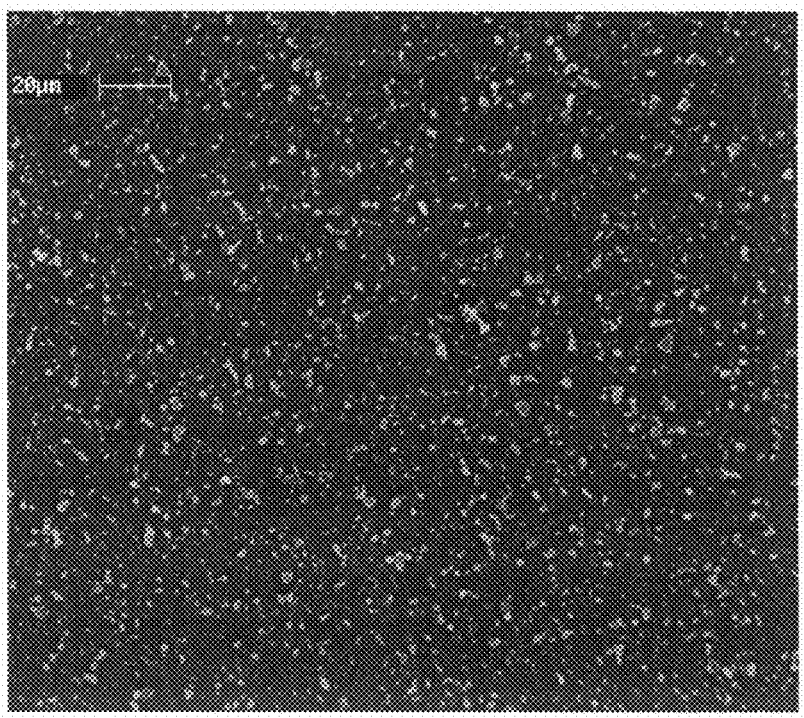
FIG. 5 shows Scanning Electron Microscope (SEM) images of the surface morphology of a GaN layer on a silicon substrate; (a) 20 μm resolution; (b) 2 μm resolution.
Figure 5B:
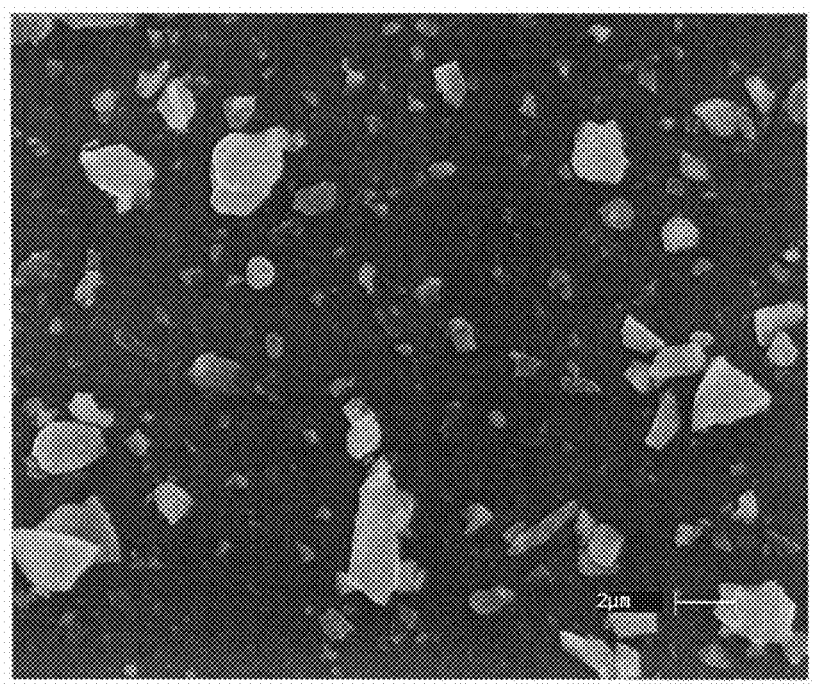

FIG. 3 shows an XRD pattern of a sample with three GaN layers deposited on a silicon substrate. The XRD patter indicates that the layer is polycrystalline GaN with wurtzite structure. The (002) peak intensity is more than ten times stronger than the intensity of the other peaks, indicating highly oriented particles on the substrate surface. This phenomena was repeatable in each sample prepared using this method, including samples prepared on other substrates.

Figure 6:
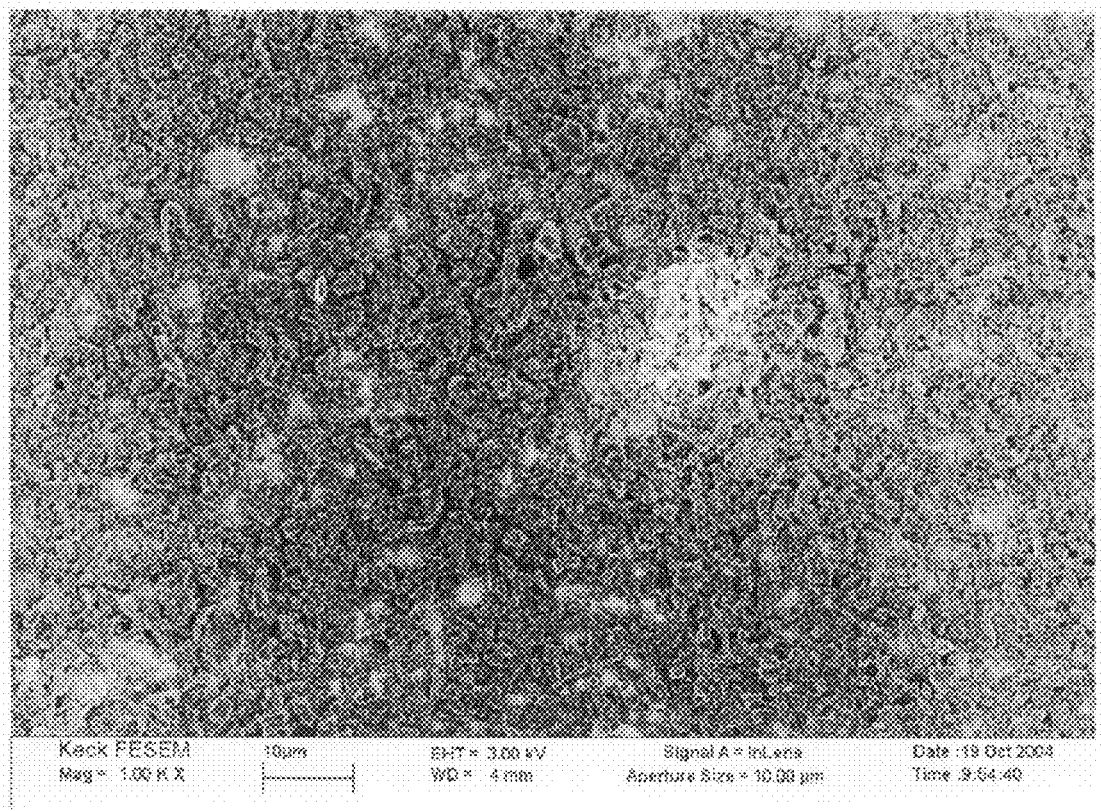
FIG. 6 shows a Scanning Electron Microscope (SEM) image illustrating the surface morphology of a thrice layered GaN thin film on a silicon substrate.

The SEM image in FIG. 6 shows the surface morphology of the GaN layer deposited on silicon. For this sample, the spin coating process was repeated three times to achieve a thick GaN layer, evenly covering the entire substrate surface. The large GaN particles are about 1-2 μm in diameter. Small GaN particles of about 0.1 μm in diameter fill the spaces between larger particles. The density of the GaN particles in the thin film can be controlled by adjusting the rotation speed in spin coating step, the centrifugation step, or both. The thickness of this film was 0.5 μm as determined by the SEM cross-section image.

Example 2

Gallium Nitride Thin Film on Glass

Figure 7:
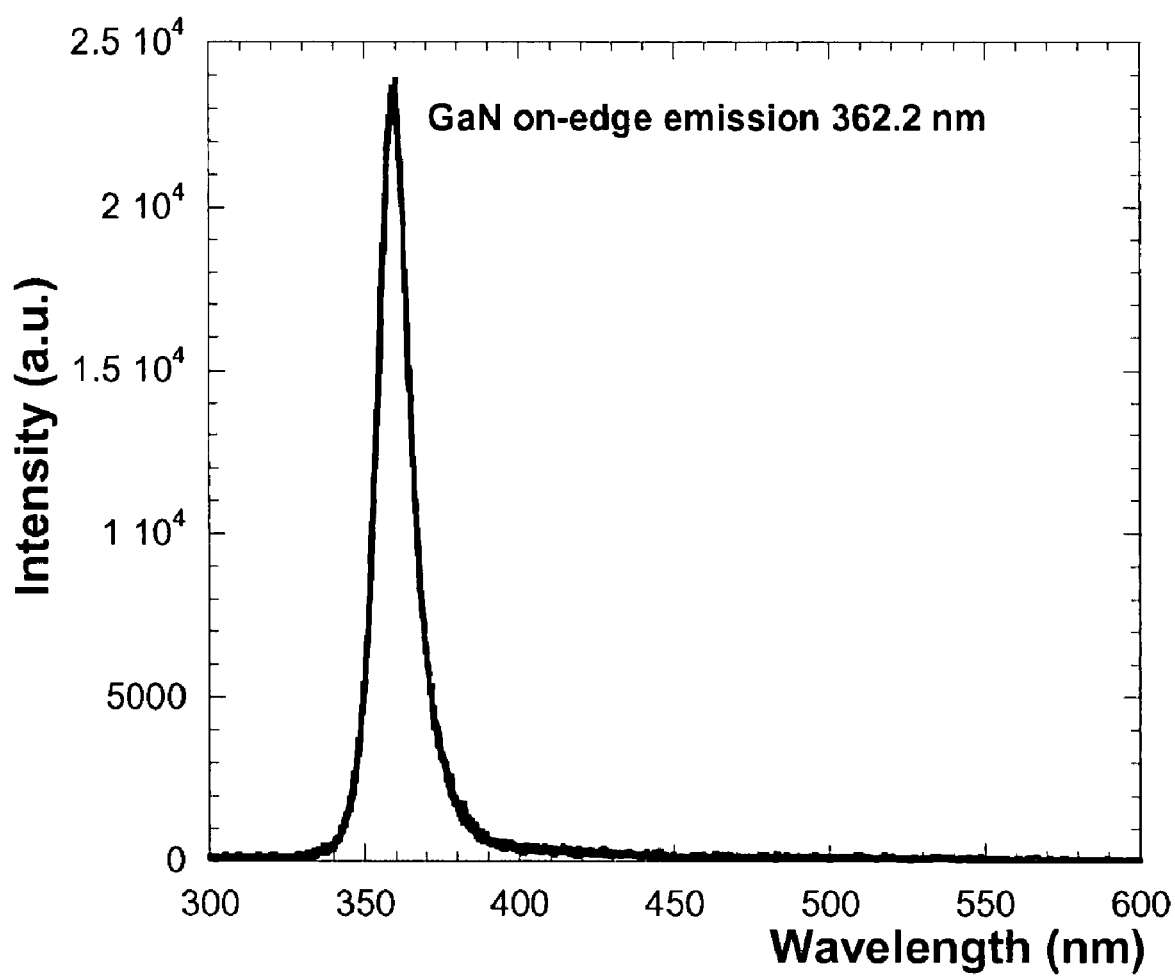
FIG. 7 illustrates a Cathodoluminescence spectrum of a GaN layered glass substrate with three coating steps; at room temperature with electrons accelerated to 5 KeV.

The procedure for Example 1 was followed, with the exception that glass was employed for the spin coating substrate. FIG. 7 is a room temperature Cathodoluminescence (CL) spectrum of a GaN layer with three coatings deposited on glass. The powder used was high-purity GaN. The excitation source was a 5 KeV electron gun focused at a 5 mm diameter point. The spectrum showed a strong band-edge emission at 362.2 nm without any deep level yellow emission. The luminescence at 3.43 eV measured at room temperature had a full width at half maximum (FWHM) of approximately 60 meV. The small FWHM and high intensity luminescence from this layer indicated excellent optical properties of the deposited GaN layer using this method. The use of high-purity GaN (>99.99%) powder resulted in improved optical and electronic properties compared to thin films prepared using lower purity GaN.

Example 3

Erbium-Doped Gallium Nitride Thin Film on Silicon

The procedure for Example 1 was followed, with the exception that erbium-doped gallium nitride (GaN:Er) was used in preparing the dispersion. The GaN was doped with erbium during the GaN synthesis.

Figure 8:
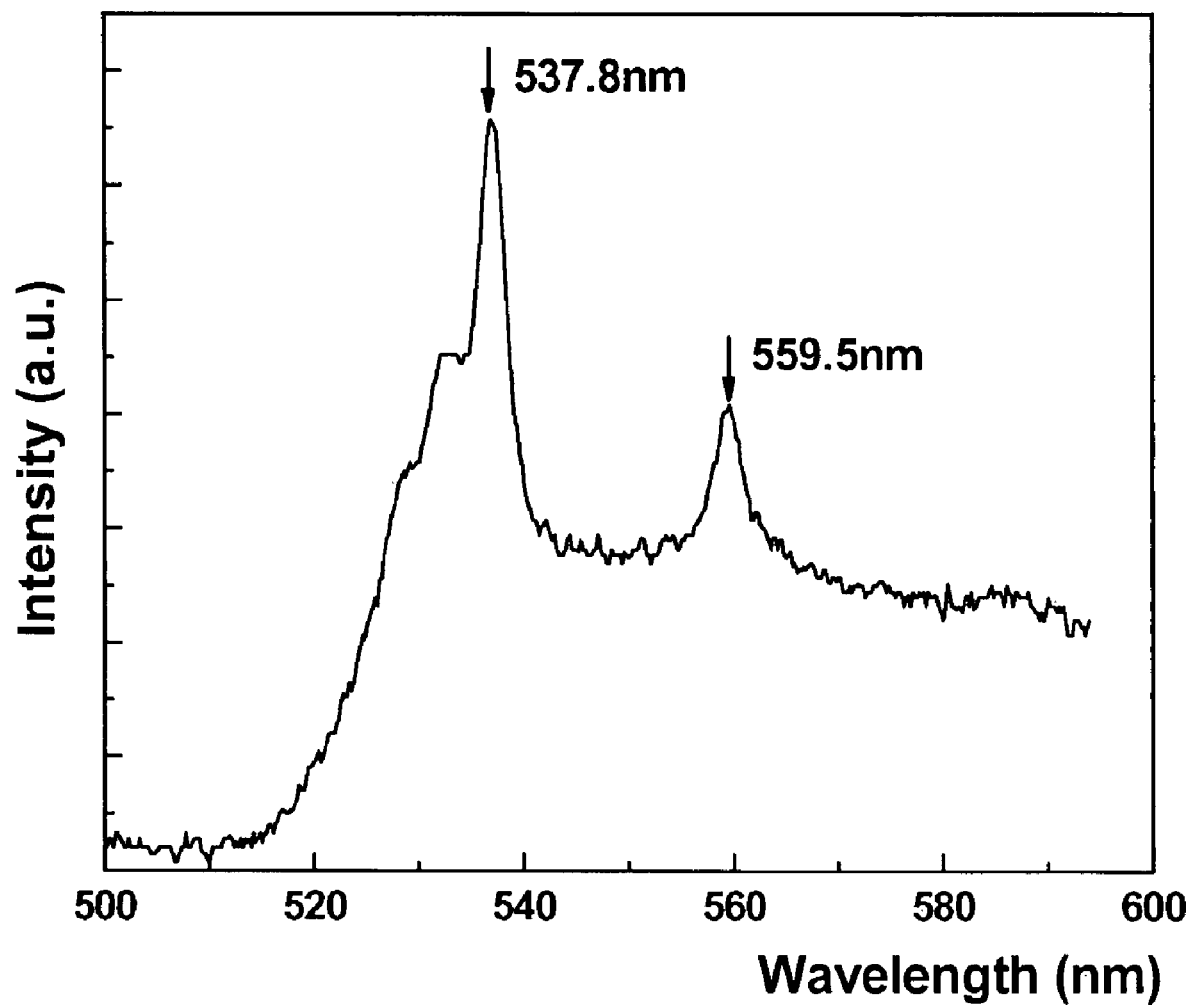
FIG. 8 illustrates a Photoluminescence spectrum of a GaN layered silicon substrate with three coating steps; at room temperature with an argon laser at a wavelength of 496.5 nm.

FIG. 8 illustrates the luminescence property of deposited GaN layer. This sample contained three coatings of GaN:Er. The photoluminescence (PL) spectrum was performed by exciting the sample with an argon laser at a wavelength of 496.5 nm at room temperature. PL excitation resulted in green emission from the erbium-doped GaN layer. Two major emissions were observed in the green region with the strongest lines at 537.8 nm and 559.5 nm, which can be attributed to transitions from each of $^2H_{11/2}$ and $^4S_{3/2}$ to the ground state $^4I_{15/2}$. The full width at half maximum (FWHM) of the 537.8 nm and 559.5 nm lines were 3.5 nm and 4.5 nm, respectively, which correspond to energy widths of 14 and 18 meV, respectively. To the left of 537.8 nm peak are detail peaks corresponding to other erbium excited electrons transitions. The peak positions in this PL spectra of the GaN:Er layer correspond well with PL spectra obtained from MOCVD grown GaN:Er layers (H. J. Lozykowski, et al., *Appl. Phys. Lett.* 1999, 74(8), 1129) or MBE grown GaN:Er layers (R. H. Birkhahn, et al., *MRS Internet J. Nitride Semicond. Res.* 1999, 4S1, G3.80; A. J. Steckl, and R. Birkhahn, *Appl. Phys. Lett.* 1998, 73(12), 1700).

Examples 2 and 3

Both CL and PL spectra indicated excellent luminescence from the deposited layers on the various substrates, including silicon and glass. These results imply a wide range of applicability in the field of light emitting and laser devices. Important advantages of this technique are low cost, low temperature processes, flexible substrate types, and large substrate sizes.

Example 4

Gallium Nitride Thin Film on Silicon #2

Methyl cellulose (150 mg) was added to DI water (15 mL) in a container, which was then covered and shaken by hand. The solution was then placed on a sonication apparatus and sonicated for 10 minutes. A magnetic stir bar was added to the container and the solution was stirred over a magnetic stir plate for 2-24 hours, until the methyl cellulose was completely dissolved. The fully dissolved solution had the appearance of a translucent gel.

High purity gallium nitride (450 mg, >99.9% pure by weight) was added to the solution, and the mixture was shaken by hand, followed by sonication for 15-30 minutes to form a dispersion. The dispersion was further mixed by stirring over a magnetic stir plate for 30 minutes, or up to about 24 hours, until the dispersion of the particles is substantially complete.

The dispersion was then transferred into a centrifugation tube and placed in a centrifugation apparatus. Centrifugation was performed at 7500 rpm for 10 minutes. This process separated non-dispersed particles from the dispersed particles. The non-dispersed particles were removed upon completion of centrifugation and the supernatant dispersion was collected.

A silicon wafer was cleaned by rinsing with isopropanol, methanol, acetone, and then water. The dispersion was again sonicated for one minute to 'refresh' the colloid. The silicon wafer was mounted on a spin coating apparatus. The dispersion was pipetted onto the silicon wafer until the entire surface was substantially covered with the dispersion. The spin coating was then performed at 2000 rpm by accelerating the wafer at 1500 rpm/second. The wafer was spun at 2000 rpm for 10 seconds, followed by deceleration. A uniform layer was formed on the silicon wafer. The wafer was allowed to air dry for 5-15 minutes.

The dry wafer was then placed in a furnace with an air atmosphere. The furnace was heated to about 500° C. by increasing the temperature by about 1° C. per minute. The wafer was heated at 500° C. for one hour, and was then allowed to cool to room temperature.

Second and third layers of gallium nitride were added by repeating the dispersion application, spin coating, and calcination, to produce a gallium nitride thin film-covered substrate with a thicker thin film.

Example 5

Gallium Nitride Thin Film on Silicon #3

Gallium nitride films of greater thickness can be prepared by repeating the coating and spin process several times. A gallium nitride thin film was prepared according to Example 1. The application and spin processes were repeated six times to achieve a thick gallium nitride layer. Gallium nitride particles evenly covered the whole surface of the silicon substrate. Most of the larger gallium nitride particles were 1-2 μm in diameter while smaller gallium nitride particles with sizes of about 0.1 μm filled the spaces between larger particles. The density of the gallium nitride particles in the layer can be controlled by adjusting the rotation speed in the spin coating step and/or the centrifuge step. The thickness of this layer was determined to be 0.5 μm as determined by an SEM cross-section image.

Example 6

Thin Film Transistor Fabrication Using Gallium Nitride Films

Most electronic devices are fabricated on crystalline wafers of silicon. The wafer size, however, is typically limited to about 300 mm using state of art technology. Crystalline silicon transistor fabrication also usually involves high temperature processes. Furthermore, it is difficult to grow sufficient crystalline silicon layers on substrates for large area display applications and solar cells. Crystalline silicon is not a suitable material for those devices because most flexible substrates are polymers that cannot withstand high temperature processes. Accordingly, there is a need for new processes that would provide thin film transistors (TFTs) for preparing flexible electronic devices.

A mobility of about 20 $cm^2/V*s$ has been demonstrated in zinc oxide (ZnO) based TFTs. Zinc oxide is also a transparent conductor because of its 3.2 eV bandgap. Gallium nitride, however, has more favorable material properties than zinc oxide based TFT in terms of transparent conductance because mobility in gallium nitride crystals is higher than in zinc oxide.

Figure 9A:
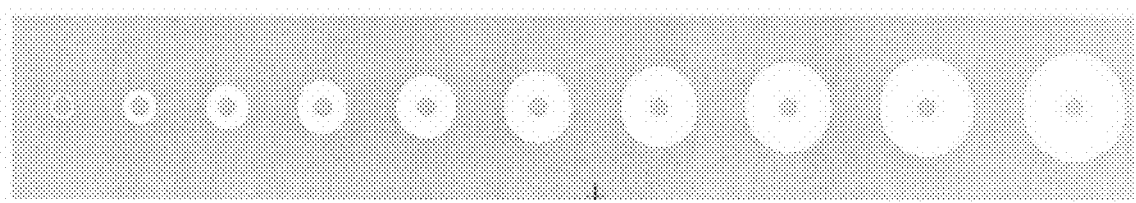
FIG. 9 illustrates (a) contact patterns for a GaN thin film, and (b) a cross section schematic of a thin film transistor device using GaN particles; according to one embodiment of the invention.
Figure 9B:
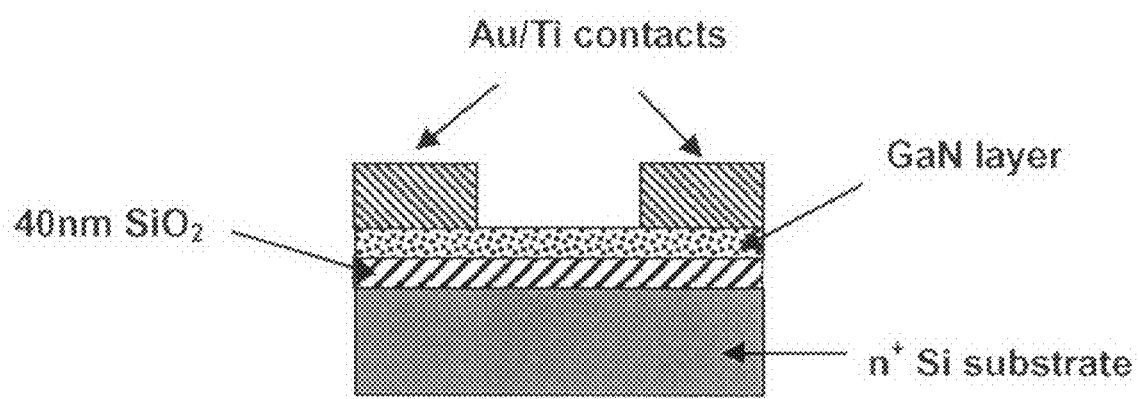

Thin films of gallium nitride particles can be used to prepare electronic devices and optoelectronic devices. The methods described herein can be used to prepare thin films on flexible substrates, including polymers. A thin film transistor (TFT) was prepared using a gallium nitride thin film according to Example 1. Current flow through the gallium nitride layer has been demonstrated. FIG. 9 shows the patterns fabricated for resistivity measurements. The circle geometry was used to avoid current spreading because the device was not isolated. The fabrication processes are as follows: a 40 nm thermally deposited $SiO_2$ layer was grown on highly doped $n^+$ Si substrate. A gallium nitride particle layer was deposited using the spin coating techniques described in Example 1. A Au/Ti (200 nm/20 nm) layer was evaporated on top of GaN layer. A lift-off technique was used to define the metal contact pattern. In the pattern, the inside circle contact was fixed with a diameter of 200 μm. The lengths of the gallium nitride layer defined by two circles varied from 50-500 μm.

Figure 10:
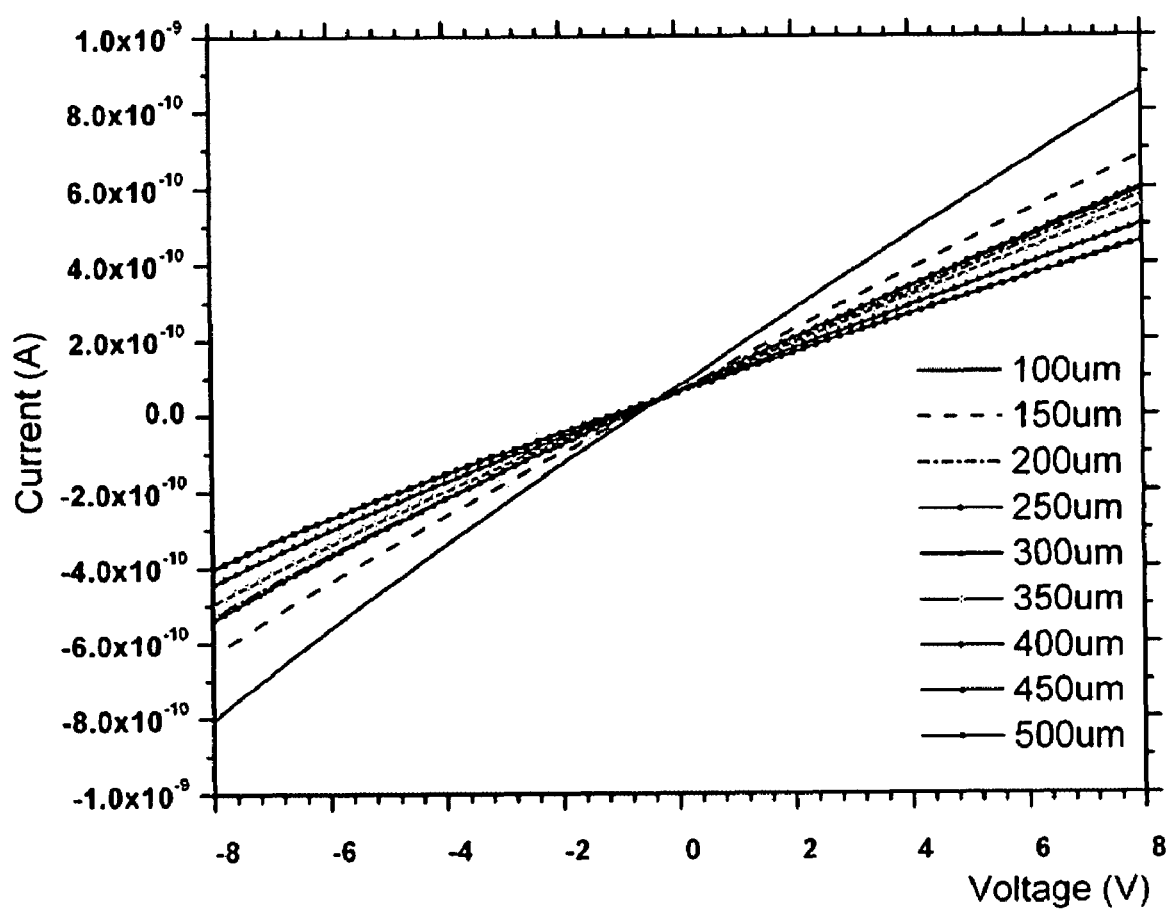
FIG. 10 illustrates V measurements of GaN particles based TFT.

FIG. 10 shows the IV measurements from a device fabricated with a gallium nitride spin coated layer. The results showed that the current was higher when the two contacts are closer. The current level was about 1 nA at 10 V applied voltage. The data indicate the feasibility for TFT applications using a gallium nitride layer produced by spin coating.

With the techniques described herein, gallium nitride particles can be layered on any suitable substrate, including silicon, polymers, and glass. The gallium nitride layer can then be used directly to prepare a thin film transistor. There are many advantages to using the spin coating technique, such as low cost, facile scale-up for large area substrates, suitability for flexible substrates, and low temperature processing.

All publications, patents, and patent documents are incorporated by reference herein, as though individually incorporated by reference. The invention has been described with reference to various specific and preferred embodiments and techniques. However, it should be understood that many variations and modifications may be made while remaining within the spirit and scope of the invention.

What is claimed is:

1. A dispersion composition comprising gallium nitride, a solvent system, and a cellulose-derived dispersant;
    wherein the gallium nitride comprises crystalline particles that are less than about 20 μm in diameter;
    the solvent system comprises at least about 95% water; and
    the cellulose-derived dispersant comprises cellulose wherein one or more hydroxyl moieties of the cellulose have been derivatized with methyl, hydroxymethyl, ethyl, hydroxyethyl, propyl, 2-hydroxypropyl, 2-hydroxybutyl, acetate, phthalate, carboxy, or carboxymethyl groups.

2. The composition of claim 1 wherein the gallium nitride comprises crystalline particles that are about 1 nm to about 10 μm in diameter.

3. The composition of claim 1 wherein the solvent system further comprises one or more of methanol, ethanol, dimethyl formamide, dimethyl sulfoxide, dimethyl acetamide, tetrahydrofuran, methylene chloride, and chloroform, in any combination.

4. The composition of claim 1 wherein the concentration of the gallium nitride in the solvent system is about 1 mg per mL to about 50 mg per mL.

5. The composition of claim 1 wherein the dispersant comprises methyl cellulose, hydroxymethyl cellulose, ethyl cellulose, hydroxyethyl cellulose (HEC), propyl cellulose, 2-hydroxypropyl cellulose (HPC), 2-hydroxyethyl methyl cellulose (HEMC), 2-hydroxyethyl ethyl cellulose (EHEC), 2-hydroxypropyl methyl cellulose (HPMC), 2-hydroxybutyl methyl cellulose, cellulose acetate, cellulose acetate phthalate, calcium carboxycellulose, sodium carboxymethyl cellulose (SCMC), carboxymethyl cellulose, or a combination thereof.

6. The composition of claim 1 wherein the dispersant is methyl cellulose or ethyl cellulose.

7. The composition of claim 1 wherein the dispersion contains a ratio of gallium nitride to dispersant that is about 1:5 to about 10:1.

8. The composition of claim 1 wherein the gallium nitride particles further comprise one or more dopants selected from beryllium, magnesium, manganese, molybdenum, silicon, zinc, cerium, erbium, europium, praseodymium, promethium, thulium, terbium, ytterbium, and yttrium, and compounds thereof, in any combination.

9. The composition of claim 8 wherein the dopant is erbium and the composition emits green light upon excitation with an effective amount of radiation.

10. The composition of claim 8 wherein the dopant is europium and the composition emits red light upon excitation with an effective amount of radiation.

11. The composition of claim 8 wherein the dopant is cerium and the composition emits yellow light upon excitation with an effective amount of radiation.

12. The composition of claim 1 comprising about 3 wt. % crystalline gallium nitride, about 1 wt. % of a dispersant, and about 96 wt. % of a solvent system.

13. The composition of claim 1 comprising about 3 wt. % crystalline gallium nitride, about 1 wt. % methyl cellulose, and about 96 wt. % water.

14. A method of preparing a gallium nitride dispersion comprising:
    dissolving a cellulose-derived dispersant in a solvent system to form a solution,
    adding crystalline gallium nitride to the solution to form a mixture, and
    agitating the mixture to form a gallium nitride dispersion;
    wherein the gallium nitride dispersion comprises crystalline gallium nitride, a solvent system, and a cellulose-derived dispersant;
    the gallium nitride comprises crystalline particles that are less than about 20 μm in diameter; the solvent system comprises at least about 95% water; and the cellulose-derived dispersant comprises cellulose wherein one or more hydroxyl moieties of the cellulose have been derivatized with methyl, hydroxymethyl, ethyl, hydroxyethyl, propyl, 2-hydroxypropyl, 2-hydroxybutyl, acetate, phthalate, carboxy, or carboxymethyl groups.

15. The method of claim 14 further comprising centrifuging the gallium nitride dispersion to provide a gallium nitride supernatant, wherein the centrifuging is performed at up to about 8000 revolutions per minute (rpm).

16. The method of claims 15 further comprising isolating the supernatant gallium nitride dispersion from larger sized particles by removing a portion of the solvent system and removing larger sized particles.

17. The method of claim 14 wherein the gallium nitride dispersion contains a ratio of gallium nitride to dispersant that is about 1:5 to about 10:1, and the concentration of the gallium nitride in the solvent system is about 1 mg per mL to about 50 mg per mL.

18. The method of claim 14 wherein the gallium nitride dispersion further comprises one or more dopants selected from beryllium, magnesium, manganese, molybdenum, silicon, zinc, cerium, erbium, europium, praseodymium, promethium, thulium, terbium, ytterbium, and yttrium, and compounds thereof, in any combination.

19. The method of claim 14 wherein the gallium nitride dispersion comprises about 3 wt. % crystalline gallium nitride, about 1 wt. % methyl cellulose, and about 95 wt. % water.

20. A dispersion composition comprising about 3 wt. % crystalline gallium nitride, a solvent system comprising at least about 95% water, and about 1 wt. % methyl cellulose as a dispersant;
    wherein the gallium nitride comprises crystalline particles that are less than about 20 μm in diameter; and the cellulose-derived dispersant comprises cellulose wherein one or more hydroxyl moieties of the cellulose have been derivatized with methyl, hydroxymethyl, ethyl, hydroxyethyl, propyl, 2-hydroxypropyl, 2-hydroxybutyl, acetate, phthalate, carboxy, or carboxymethyl groups.

21. The composition of claim 20 wherein the gallium nitride particles further comprise one or more dopants selected from beryllium, magnesium, manganese, molybdenum, silicon, zinc, cerium, erbium, europium, praseodymium, promethium, thulium, terbium, ytterbium, and yttrium, and compounds thereof, in any combination.

22. The composition of claim 21 wherein the dopant is erbium.

23. The composition of claim 21 wherein the dopant is europium.

24. The composition of claim 21 wherein the dopant is cerium.

25. A dispersion composition comprising gallium nitride, a solvent system, a cellulose-derived dispersant, and a dopant; wherein the gallium nitride comprises crystalline particles that are less than about 20 μm in diameter; the cellulose-derived dispersant comprises cellulose wherein one or more hydroxyl moieties of the cellulose have been derivatized with methyl, hydroxymethyl, ethyl, hydroxyethyl, propyl, 2-hydroxypropyl, 2-hydroxybutyl, acetate, phthalate, carboxy, or carboxymethyl groups; and the dopant is erbium, europium, or cerium.

26. The composition of claim 25 wherein the solvent system comprises at least about 95% water.

27. The composition of claim 26 wherein the solvent system further comprises one or more of methanol, ethanol, dimethyl formamide, dimethyl sulfoxide, dimethyl acetamide, tetrahydrofuran, methylene chloride, and chloroform, in any combination.

28. The composition of claim 27 that comprises about 3 wt. % crystalline gallium nitride and about 1 wt. % methyl cellulose.

29. The composition of claim 28 wherein the gallium nitride comprises crystalline particles that are about 1 nm to about 10 μm in diameter.

30. The composition of claim 29 wherein the concentration of the gallium nitride in the solvent system is about 1 mg per mL to about 50 mg per mL.

31. The composition of claim 30 wherein the dispersant comprises methyl cellulose, hydroxymethyl cellulose, ethyl cellulose, hydroxyethyl cellulose (HEC), propyl cellulose, 2-hydroxypropyl cellulose (HPC), 2-hydroxyethyl methyl cellulose (HEMC), 2-hydroxyethyl ethyl cellulose (EHEC), 2-hydroxypropyl methyl cellulose (HPMC), 2-hydroxybutyl methyl cellulose, cellulose acetate, cellulose acetate phthalate, calcium carboxycellulose, sodium carboxymethyl cellulose (SCMC), carboxymethyl cellulose, or a combination thereof.

32. The composition of claim 31 wherein the dispersant is methyl cellulose or ethyl cellulose.

33. The composition of claim 32 wherein the dispersion contains a ratio of gallium nitride to dispersant that is about 1:5 to about 10:1.

34. The composition of claim 33 comprising about 3 wt. % crystalline gallium nitride and about 1 wt. % of a dispersant.

35. The composition of claim 34 wherein the dispersant is methyl cellulose.

* * * * *

UNITED STATES PATENT AND TRADEMARK OFFICE
CERTIFICATE OF CORRECTION

PATENT NO.       : 7,772,288 B2                                       Page 1 of 1
APPLICATION NO.  : 11/809879
DATED            : August 10, 2010
INVENTOR(S)      : Huaqiang Wu et al.

It is certified that error appears in the above-identified patent and that said Letters Patent is hereby corrected as shown below:

On the Title Page, Item (56), under "Other Publications", line 5, delete "Seial" and insert -- Serial --, therefor.

In column 2, lines 5–6, delete "light-emission" and insert -- light emission --, therefor.

In column 3, line 1, delete "an" and insert -- a --, therefor.

In column 14, line 43, in Claim 16, delete "claims" and insert -- claim --, therefor.

Signed and Sealed this

Twelfth Day of October, 2010

David J. Kappos
*Director of the United States Patent and Trademark Office*